(12) United States Patent
Chiba

(10) Patent No.: US 6,627,468 B2
(45) Date of Patent: Sep. 30, 2003

(54) METHOD FOR MANUFACTURING OPTICAL ELEMENT, OPTICAL ELEMENT, OPTICAL SYSTEM USING OPTICAL ELEMENT, OPTICAL APPARATUS AND EXPOSURE APPARATUS USING OPTICAL SYSTEM, AND METHOD FOR MANUFACTURING DEVICE

(75) Inventor: Keiko Chiba, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 89 days.

(21) Appl. No.: 09/875,009

(22) Filed: Jun. 7, 2001

(65) Prior Publication Data

US 2001/0055826 A1 Dec. 27, 2001

(30) Foreign Application Priority Data

Jun. 16, 2000 (JP) ........................................ 2000-181217

(51) Int. Cl.$^7$ .................................................. H01L 21/00
(52) U.S. Cl. ........................... 438/24; 65/17.3; 65/30.1; 359/335; 438/22; 438/23
(58) Field of Search ................................. 65/17.3, 30.1; 359/355; 438/24

(56) References Cited

U.S. PATENT DOCUMENTS

| 5,699,183 | A | * | 12/1997 | Hiraiwa et al. | ............ | 359/355 |
| 5,865,867 | A | * | 2/1999 | Kinoshita | .................... | 65/17.3 |
| 6,174,830 | B1 | | 1/2001 | Jinbo et al. | .................... | 501/54 |
| 6,269,661 | B1 | * | 8/2001 | Jinbo et al. | .................. | 65/30.1 |

FOREIGN PATENT DOCUMENTS

| JP | 6-48734 | 2/1999 |
| JP | 10-330120 | 12/1999 |
| JP | 2000-56113 | 2/2000 |

* cited by examiner

Primary Examiner—David Nelms
Assistant Examiner—Reneé R. Berry
(74) Attorney, Agent, or Firm—Fitzpatrick, Cella, Harper & Scinto

(57) ABSTRACT

The present invention provides a method for manufacturing an optical element to be used for an optical system and an optical instrument using the optical system, and a method for manufacturing a device using the optical instrument, wherein the optical element is manufactured by the steps including the steps for processing a high purity silica glass by lithography, and the hydrogen molecule content is adjusted after manufacturing the optical element.

34 Claims, 7 Drawing Sheets

51 BLAZING
50 FRESNEL LENS

53 STEPPED CROSS SECTION
52 BINARY OPTICS

55 DIFFRACTIVE OPTICAL ELEMENT

METHOD FOR MANUFACTURING OPTICAL ELEMENT, OPTICAL ELEMENT, OPTICAL SYSTEM USING OPTICAL ELEMENT, OPTICAL APPARATUS AND EXPOSURE APPARATUS USING OPTICAL SYSTEM, AND METHOD FOR MANUFACTURING DEVICE

BACKGROUND OF THE INVENTION

1. Field of the Invention

The present invention relates to a method for manufacturing an optical element, an optical element, an optical system using the optical element, an optical apparatus and exposure apparatus using the optical system, and a method for manufacturing a device. In particular, the present invention relates to a diffractive optical element suitable for semiconductor equipments and a method for manufacturing the diffractive optical element, an optical system and optical instrument using the diffractive optical element, and a device and a method for manufacturing the device.

2. Description of the Related Art

Refractive optical elements such as a lens and prism are frequently used for optical systems constituting optical instrument. Particularly, the diffractive optical element has been used as an optical element for converting a incident wavefront into a desired wavefront. This diffractive optical element has characteristics that are not found in the refractive optical element such that, for example, it has an inverse dispersion value to that of the refractive optical element, and the optical system can be compactly arranged.

The diffractive optical element has been manufactured by mechanical grinding, or by using a mold manufactured by mechanical grinding. However, the optical element is desirably manufactured with pitches as fine as possible, in order to endow the diffractive optical element with a large power as an optical element. Accordingly, applying a semiconductor manufacturing process has been considered.

A semiconductor manufacturing technology is usually applicable when the diffractive optical element assumes a binary shape. This technology enables fine pitches to be manufactured with high precision as compared with conventional mechanical grinding method. Consequently, a binary type diffractive optical element in which blazed shapes are approximated by stepped shapes has been actively studied in recent years.

The binary optics will be described in detail hereinafter with reference to FIGS. 7A, 7B and 8.

In FIG. 7, the reference numeral 50 denotes a Fresnel lens, the reference numeral 51 denotes a blazed shape, the reference numeral 52 denotes a binary optics, and the reference numeral 53 denotes a stepped shape. In FIG. 8, the reference numeral 55 shows a whole view of the diffractive optical element.

Ideally, the Fresnel lens 50 as a diffractive optical element should have a cross section of the blazed shape 51 as shown in FIG. 7A, which enables light diffraction ratio against the design wavelength to reach almost 100%. However, since machining into a perfect blazed shape 51 is actually difficult, the blazed shape 51 is approximated by quantization to form a binary optics 52 having a stepped cross section 53 as shown in FIG. 7B. Although the binary optics 52 is an approximation of the Fresnel lens 50, it ensures a diffraction efficiency of the primary diffraction light of 90% or more.

The minimum line width of the diffractive optical element should be as fine as possible in order to enhance the degree of approximation and to endow the diffractive optical element with high power as an optical element. Accordingly, a lithography process that has been experienced in the production of semiconductors is used for obtaining a high performance diffractive optical element.

The semiconductor manufacturing apparatus as used herein is designed on the premise that a wafer with a thickness of less than 1 mm is handled. Consequently, the diffractive optical element manufactured by using the semiconductor lithography process is formed as a wafer-shaped optical member.

Assume that the diffractive optical element obtained by the manufacturing method as described above is employed as the optical system of a semiconductor exposure apparatus using an eximer laser such as a KrF, ArF or F2 laser. FIG. 4 shows a schematic drawing of the exposure apparatus for manufacturing semiconductors.

In FIG. 4, the letter A denotes a light source of an eximer laser such as a KrF, ArF or F2 laser. A light flux C from the light source is guided to an illumination optical system D by a mirror B, and the light flux after passing through the illumination optical system illuminates the surface of a reticle E as a first block. The light flux carrying a line of reticle information is projected onto a light-sensitive substrate (a wafer) G through a reductive projection optical system F. The letter H denotes a wafer stage, which adjust the wafer G at a focal point by means of the wafer stage H.

While an oxide such as alumina and silica glass, or a fluoride such as calcium fluoride and magnesium fluoride may be used as a material of the optical element using a light source of the eximer laser such ad KrF, ArG or F2 laser, silica glass is mainly used since it is suitable for machining, homogeneous and has a low thermal expansion coefficient. As disclosed in Japanese Patent Publication No. 6-48734, the concentrations of OH group and hydrogen molecules are further controlled in a high purity synthetic silica glass (synthetic silica glass) prepared by controlling the content of impurities in order to use the material as silica glass on which a laser beam having a wavelength of 300 nm or less is irradiated from the eximer laser source such as the KrF, ArF or F2 laser, thereby permitting such silica glass to be used as a material having high resistivity against a long term laser irradiation.

However, the quality of silica glass as disclosed in Japanese Patent Publication No. 6-48734 has been controlled on the premise that it is used for a refractive optical element commonly called as a lens. Japanese Patent Laid-Open No. 10-330120 discloses a method for controlling the hydrogen concentration in the silica glass for irradiating with the eximer laser by annealing, wherein discussions have been mainly related to the silica glass having a minimum thickness of 10 mm or more by adjusting the thickness of the silica glass before annealing to be larger than 10 mm or more as compared with the finally required thickness.

In manufacturing the diffractive optical element through the lithography process, the semiconductor manufacturing apparatus to be used for this purpose is designed within a range of the standard of the wafer, and the highest accuracy is obtained within the range. While a variety of standards of the wafer are known, the outer diameter is defines to be 150 mm (6 inches), 200 mm (8 inches) and 300 mm (12 inches), and the range of thickness is also defined depending on each size. The thickness of the wafer is 1 mm or less, forming a substrate far more thinner than the conventional optical elements. However, remodeling of the semiconductor manufacturing apparatus so as to be used out of the Si wafer standard makes it difficult to maintain its accuracy.

Resist patterning and etching steps are included in the detailed lithography process. In the resist patterning steps, an organic resist is coated, the coating pattern is exposed to a light through a reticle on which a planar shape to be printed is formed, and a resist pattern having a desired planar shape is formed after baking and development steps. Since an apparatus called a spinner, which allows the substrate to rotate at a high speed to coat the resist with a uniform film thickness, is used for coating the resist, the heavier substrate gives so much load on the spinner that control of rotation turns out to be difficult.

While a hot plate is used in the baking step with a strict temperature control in a unit of second, temperature control of a substrate such as silica glass having a low heat conductivity and large thickness is quite difficult. Meanwhile, although the substrate is etched with chemicals using the resist pattern as a mask, or the substrate is processed with a dry etching machine using a plasma, the dry etching method is mainly used since its accuracy is high. While the dry etching machine requires a device for cooling the substrate, temperature control of a substrate such as silica glass having a low heat conductivity and large thickness is quite difficult as in baking step.

The diffractive optical element preferably has a thickness close to the thickness defined in the standard of the Si wafer that is thinner than 1 mm, when the diffractive optical element is manufactured using the semiconductor manufacturing process. The process is significantly different from the process for manufacturing the refractive optical element comprising only the grinding process. The material is coated with an organic compound, heated or cooled at a desired temperature, exposed to a chemical solution, heated in vacuum, and subjected to plasma implantation in each step for manufacturing the optical element by the semiconductor manufacturing process.

Japanese Patent Application No. 2000-56113 discloses a method in which the optical element is directly bonded to a different thick material, in order to prevent deformation by the weight of the optical element, by holding the optical element, and by the effect of atmospheric pressure changes that adversely affect the optical performance of the element. However, a heating treatment is necessary for improving the bonding strength, sometimes requiring a long period of heating at a temperature range of 200 to 400° C., or at a temperature range of as high as 400 to 1000° C.

The diffractive optical element manufactured by the process as described above involves the following two problems. One problem is that hydrogen molecules doped before processing are discharged by exposing the thin plate to various environment to change the hydrogen molecule content, thereby inducing deterioration of silica glass (such as decrease of transmittance and change of refractive index) by a long period of irradiation of the laser beam.

The other problem is that the surface of silica glass is denatured by heating the element while an organic substance is coated on its surface, or by implantation with plasma.

SUMMARY OF THE INVENTION

The present invention for solving the problems as hitherto described provides a method for manufacturing an optical element comprising the steps of processing a high purity synthetic silica glass by lithography, and allowing the silica glass to contain hydrogen, wherein the lithography process comprises resist process, exposure, development and etching.

The silica glass may be treated with a chemical solution containing hydrofluoric acid after the lithography process.

Each of the silica glass and the optical element preferably contains hydrogen molecules in a concentration of (5E+16 molecules/cm$^3$) to (5E+19 molecules/cm$^3$).

Preferably, each of the silica glass and the optical element has a thickness of 0.5 to 10 mm.

The optical element may be used for an eximer laser.

The optical element may be irradiated with an eximer laser with an intensity of 0.01 to 1 mJ/cm$^2$/pulse, and contains hydrogen molecules in a concentration of (5E+16 molecules/cm$^3$) to (5E+18 molecules/cm$^3$). The optical element may be also irradiated with an eximer laser with an intensity of 1 to 100 mJ/cm$^2$/pulse, and contains hydrogen molecules in a concentration of (5E+18 molecules/cm$^3$) to (5E+19 molecules/cm$^3$).

The optical element may be a diffractive optical element, each of the silica glass and optical element has a thickness within a range of 0.5 mm to 10 mm, and the optical element contains hydrogen molecules in a concentration of (5E+16 molecules/cm$^3$) to (5E+19 molecules/cm$^3$).

The optical element is manufactured by the method according to the present invention, and the optical system preferably comprises at least one optical element.

Preferably, substantially all the high purity synthetic silica glass placed on the optical path of the optical system is manufactured by the method according to the present invention.

The present invention also provides an optical instrument constructed by using the optical system according to the present invention.

The present invention also provides an exposure apparatus comprising an optical system for illuminating the pattern with a light from a light source, and a projection optical system for projecting the light from the pattern onto a light-sensitive substrate, wherein at least one of the illumination optical system and projection optical system is the optical system according to the present invention.

The present invention also provides a method for manufacturing a device using the exposure apparatus according to the present invention.

The present invention provides a method for manufacturing an optical element comprising the steps of processing a high purity synthetic silica glass by lithography, and allowing the silica glass to contain hydrogen before processing the silica glass.

In the present invention for manufacturing an optical element, a high purity synthetic silica glass is processed by lithography followed by a dry etching step, and the dry etching step is carried out in an etching gas added hydrogen gas.

Further objects, features and advantages of the present invention will become apparent from the following descriptions of the preferred embodiments with reference to the attached drawings.

DESCRIPTION OF THE PREFERRED EMBODIMENTS

According to the embodiments of the present invention, an optical element finally containing an optimum amount of hydrogen molecules is manufactured by doping the hydrogen after manufacturing the optical element by a semiconductor process, or by using a silica glass containing an excess amount of hydrogen, by applying the construction of the present invention as hitherto described. Consequently, the optical element may be so constructed as to reliably exert the designed optical performance for a long period of time in combination with a hydrofluoric acid treatment, without causing decreased transmittance of the optical element due to deterioration of the silica glass surface, or without deterioration of silica glass by irradiating with a laser beam for a long period of time.

The number of the optical elements may be reduced by constructing the optical system mounting the optical elements, and the semiconductor exposure apparatus mounting the optical system, by applying the construction according to the present invention. As a result, light absorption by the silica glass is decreased to enable deformation of the optical element and refractive index changes due to absorbed heat to be suppressed. Chromatic aberration may be so easily corrected that the laser wavelength band may be widened to effectively utilize the laser power. Reducing aberration also enables the designed performance to be fully exerted to improve image forming ability.

The present invention also provides a device and a method for manufacturing the device with high accuracy, by constructing the semiconductor exposure apparatus using the optical system mounting the optical elements by applying the construction according to the present invention.

EXAMPLES

Example 1

FIGS. 1A to 1G show the steps for manufacturing the diffractive optical element according to the present invention, which illustrate a cross section in the diameter direction passing through the center. The diffractive optical element according to the present invention is used in the irradiation optical system of the semiconductor exposure apparatus using an ArF laser ($\lambda$=193 nm). The laser is used at an irradiation intensity of 30 mJ/cm$^2$/pulse. The silica glass 1 in FIG. 1A contains hydrogen molecules in a concentration of (1E+19 molecules/cm$^3$). The silica glass 1 to be used in this example is a parallel-faced plate made of silica glass with a diameter (a) of 150 mm and a thickness (t) of 1 mm.

The method for manufacturing the diffractive optical element using a silica glass substrate 1 and the semiconductor manufacturing apparatus will be described hereinafter with reference to FIGS. 1A to 1G.

Figure 1A:
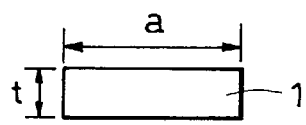
FIG. 1A is provided for describing a manufacturing step in the examples 1 or 2 according to the present invention.
Figure 1B:
FIG. 1B is provided for describing a manufacturing step in the examples 1 or 2 according to the present invention.

For patterning a fine pattern, a resist 2 comprising a photosensitive organic material is coated (FIG. 1B). The resist should be controlled within a thickness of about 5 nm relative to the total thickness of about 1 $\mu$m, in order to apply submicron order of processing, although it depends on the line width to be processed. Accordingly, a solution of the resist is coated by allowing the substrate to rotate using a so-called spinner in the conventional semiconductor manufacturing process. Other methods such as dipping may be used, provided that a sufficient accuracy can be ensured by these methods. However, coating with the highest accuracy can be attained by using the spinner.

Figure 1C:
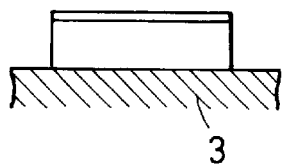
FIG. 1C is provided for describing a manufacturing step in the examples 1 or 2 according to the present invention.

Then, the substrate is pre-baked for allowing the solvent in the resist solution to evaporate. The substrate is baked from its back face using a hot-plate 3 as shown in FIG. 1C in the conventional semiconductor manufacturing process. An oven (not shown) may be used in place of the hot-plate shown in FIG. 1C. A highly accurate temperature control is required in using a recently developed chemically amplified resist.

Figure 1D:
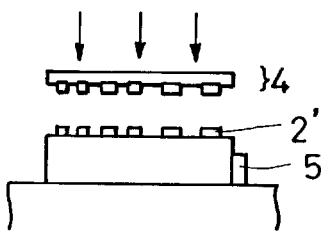
FIG. 1D is provided for describing a manufacturing step in the examples 1 or 2 according to the present invention.

The substrate is additionally exposed using an i-line via a reticle 4 on which a planar shape to be patterned is formed as shown in FIG. 1D. The height (z-direction) of the substrate is positioned in the exposure apparatus, so that the focus of the exposure light settles on the substrate. Since the thickness of the substrate such as a Si wafer is usually standardized, displacement range of the substrate for focusing is 1 mm or less. A protrusion 5 is used for initial positioning in the X- and Y-directions.

A resist pattern 2' having a desired planar shape with a minimum line width of 0.35 $\mu$m is formed as shown in FIG. 1D, after applying a post-exposure bake (PEB), development and post bake again. A heating plate or an oven may be used for these bake steps, as in the pre-bake step. The spinner is used again for paddle development in the development step.

Figure 1E:
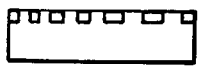
FIG. 1E is provided for describing a manufacturing step in the examples 1 or 2 according to the present invention.

Subsequently, the silica glass substrate is processed by etching as shown in FIG. 1E. The substrate is etched with a chemical reagent using the resist pattern as a mask, or by using a dry-etching apparatus using a plasma. The dry etching method having a high accuracy is used for forming a submicron order of fine line width. Since plasma etching in vacuum is used in the dry etching apparatus, chemical etching as well as physical etching may be simultaneously applied, in contrast to the etching method using chemical reagents.

Figure 1F:
FIG. 1F is provided for describing a manufacturing step in the examples 1 or 2 according to the present invention.
Figure 7A:
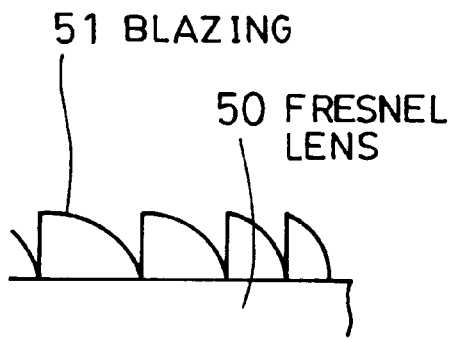
FIG. 7A illustrates a diffractive optical element.
Figure 7B:
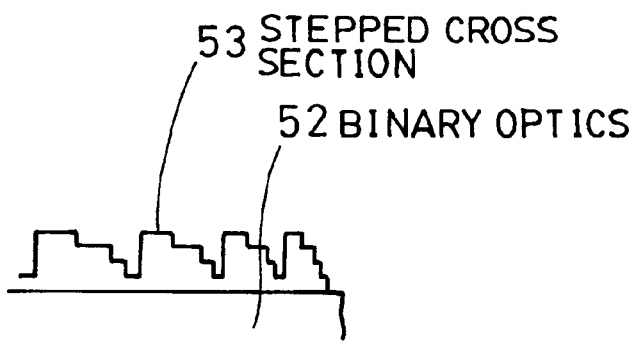
FIG. 7B illustrates another diffractive optical element.
Figure 8:
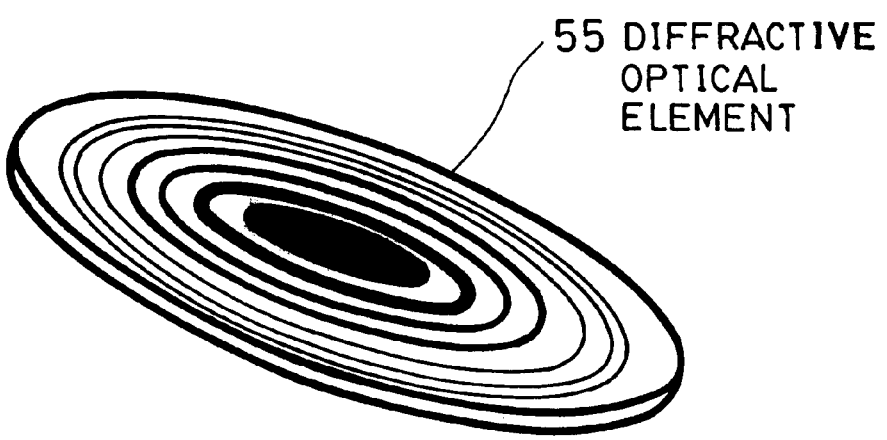
FIG. 8 illustrates a diffractive optical element.

The step shapes as shown in FIG. 1F, or a eight-step binary optics with a minimum pitch of 2.8 $\mu$m as shown by the reference numeral 52 in FIG. 7B, can be formed as a diffractive optical element 6 on the silica glass substrate, by repeating the steps in FIGS. 1B to 1E. The back face of the substrate may be ground again, in order to ensure a required surface roughness for the optical element.

However, the surface of the silica glass is degenerated by coating organic materials, subjecting to a high temperature, exposing to chemical reagents, heating in vacuum, and implanting a plasma in respective steps. Transmittance of the ArF laser light has been actually decreased by 0.1 to 1%.

Transmittance of the diffractive optical element 6 was recovered by dipping it in a 5% hydrofluoric acid solution for 1 minute to etch the surface. The element was etched without causing a large change in the pattern. While any concentration of hydrofluoric acid in the range of 0.5% to 10% may be used, the etching rate as well as the etching time are varied in accordance with the concentration. The depth of the degeneration layer is also controlled in accordance with the recovery process, since it is also changed depending on the process conditions. A reticle considering the degree of variation by etching may be prepared, since the shape (pattern width) may be affected by the degree of isotropic etching.

An analysis with a Raman spectrophotometer showed that the hydrogen concentration in this substrate has been decreased to (2E+18 molecules/cm$^3$), suggesting a possibility of deterioration of the silica glass substrate by irradiating a laser having an intensity of 30 mJ/cm$^2$/pulse for a long period of time.

Figure 1G:
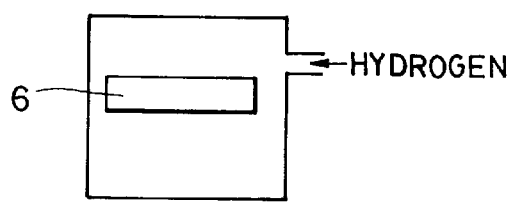
FIG. 1G is provided for describing a manufacturing step in the examples 1 or 2 according to the present invention.
Figure 2:
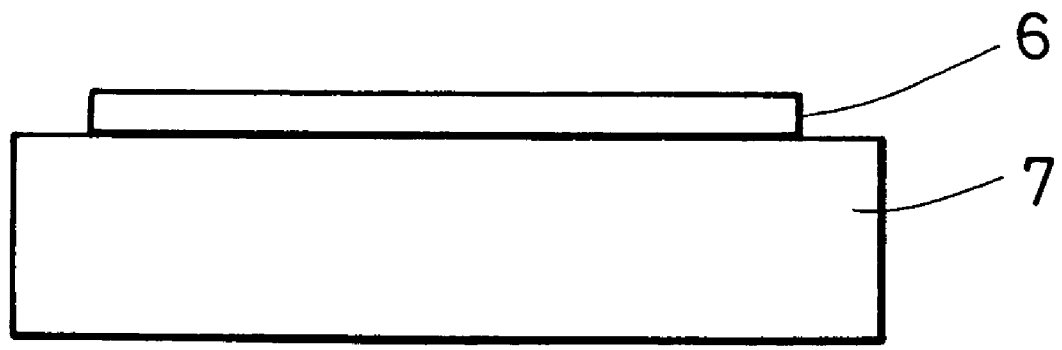
FIG. 2 is provided for describing the bonding steps in the example 2 according to the present invention.

As shown in FIG. 1G, hydrogen molecules can be again doped into the silica glass substrate by heating under a controlled pressure of the hydrogen gas atmosphere of 10 atm (1013.25 Pa), showing a recovery of the hydrogen concentration up to (1E+19 molecules/cm$^3$).

While hydrogen molecules were doped again after the hydrofluoric acid treatment, the order of the treatments may be reversed.

The problems of decrease of transmittance due to deterioration of the surface of the silica glass, or deterioration of silica glass caused by irradiation of the laser light for a long period of time, can be solved by applying a hydrofluoric acid treatment or by doping hydrogen molecules after manufacturing the diffractive optical element. Accordingly, the designed optical performance can be certainly displayed for a long period of time with no change of optical characteristics of the diffractive optical element.

Example 2

The diffractive optical element in this example is used for the projection optical system of the semiconductor exposure apparatus using the ArF laser ($\lambda$=193 nm). The irradiation intensity is 0.1 mJ/cm$^2$/pulse. The silica glass 1 in FIG. 1A contains hydrogen molecules in a concentration of (5E+17 molecules/cm$^3$).

The silica glass used in this example is a parallel faced plate of silica glass with a diameter (a) of 200 mm and a thickness (t) of 1 mm.

The diffractive optical element 6 as shown in FIG. 1F is manufactured using the same steps for manufacturing a semiconductor (including the step of treating with hydrofluoric acid) as in Example 1. However, the substrate as thin as 1 mm may suffer the influences of the weight of the substrate, holding of the substrate and changes of the atmospheric pressure. The degree of deformation is so large that aberration may be caused to adversely affect the performance of the semiconductor exposure apparatus. As a countermeasure thereof, the diffractive optical element 6 may be directly bonded on a thick different member 7 (silica glass or calcium fluoride). While the substrate may be directly bonded on the different member at room temperature, it is usually heated at 200 to 600° C. for 1 to 2 hours in order to improve the bonding strength. However, the hydrogen molecule concentration further decreases by the heat treatment in addition to the decrease during the usual process for manufacturing the diffractive optical element.

An analysis with a Raman spectrophotometer showed a measurement limit concentration of hydrogen of (1E+17 molecules/cm$^3$), because he substrate is heated at 400° C. for 1 hour in this example.

Hydrogen molecules can be doped again into the silica glass substrate by heating under a controlled hydrogen gas atmosphere at a pressure of 1 atm (1013.25 Pa), showing a recovery of the hydrogen concentration up to (5E+19 molecules/cm$^3$).

A hydrofluoric acid treatment and doping of hydrogen molecules after manufacturing the diffractive optical element can suppress decrease of transmittance due to degeneration of the surface of the silica glass, or degeneration of the silica glass by a long period of irradiation of the laser beam. Accordingly, the designed optical performance can be certainly displayed for a long period of time with no change of optical characteristics of the diffractive optical element.

Example 3

FIGS. 3A to 3H show the steps for manufacturing the diffractive optical element according to the present invention, which illustrate a cross section in the diameter direction passing through the center.

The diffractive optical element in this example is used for a semiconductor exposure apparatus using a KrF laser ($\lambda$=248 nm). The irradiation intensity is 0.5 mJ/cm$^2$/pulse. The silica glass 8 in FIG. 3A contains hydrogen molecules in a concentration of (3E+18 molecules/cm). The substrate 1 to be used in this example is a flat convex substrate with a diameter (a) of 200 mm made of silica glass.

The method for manufacturing the diffractive optical element using the silica glass substrate 1 is shown in FIGS. 3A to 3H, wherein semiconductor manufacturing process is applied. A holding member 9 is attached to the silica glass 8 so that the substrate can be handled by the same method as in the parallel-faced flat plate, and the diffractive optical element is manufactured by the steps illustrated in FIGS. 3A to 3H similar to the steps in Example 1.

Figure 3A:
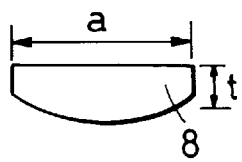
FIG. 3A is provided for describing the manufacturing steps in the example 3 according to the present invention.
Figure 3B:
FIG. 3B is provided for describing the manufacturing steps in the example 3 according to the present invention.
Figure 3C:
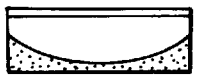
FIG. 3C is provided for describing the manufacturing steps in the example 3 according to the present invention.
Figure 3D:
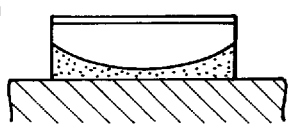
FIG. 3D is provided for describing the manufacturing steps in the example 3 according to the present invention.
Figure 3E:
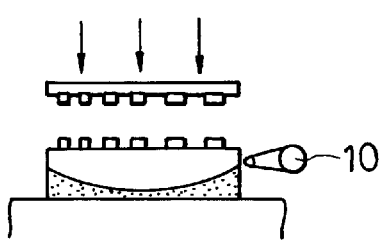
FIG. 3E is provided for describing the manufacturing steps in the example 3 according to the present invention.
Figure 3F:
FIG. 3F is provided for describing the manufacturing steps in the example 3 according to the present invention.
Figure 3G:
FIG. 3G is provided for describing the manufacturing steps in the example 3 according to the present invention.
Figure 3H:
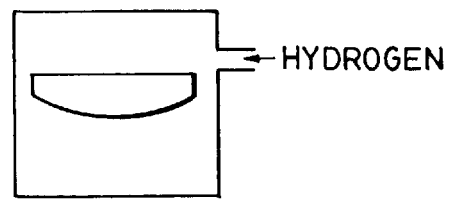
FIG. 3H is provided for describing the manufacturing steps in the example 3 according to the present invention.

A highly precise positioning for aligning the optical center of the convex substrate with the optical center of the diffractive optical element is required during the exposure step in FIG. 3E. While positioning was performed by specifying the center position from the peripheral profile using a micrometer 10, this method requires that the relation between the optical center of the convex substrate and the peripheral profile should be recognized in advance.

Otherwise, exposure is possible by positioning through direct measurement of the optical center, although this method is not shown in the drawing.

Hydrogen molecules were doped again after manufacturing the diffractive optical element by the steps as described above, thereby recovering the hydrogen molecule concentration up to (3E+18 molecules/cm$^3$).

Increase of the optical path length may be suppressed, or the optical path length may be reduced in the entire optical system by integrating a refractive optical element with the diffractive optical element.

A hydrofluoric acid treatment and recovery of the hydrogen content once reduced permit decrease of transmittance due to degeneration of the silica glass surface, and deterioration of silica glass due to a long period of irradiation of the laser beam to be prevented. Accordingly, the designed optical performance can be certainly displayed for a long period of time with no change of optical characteristics of the diffractive optical element.

Example 4

The diffractive optical element in this example is used for a semiconductor exposure apparatus using a ArF laser ($\lambda$=193 nm). The irradiation intensity is 0.2 mJ/cm$^2$/pulse. The silica glass contains hydrogen molecules in a concentration of (8E+18 molecules/cm$^3$), which is an excess amount of hydrogen to be contained the silica glass used at the intensity above.

The hydrogen molecule content was adjusted to (1E+18 molecules/cm$^3$) by manufacturing the diffractive optical element through the steps as in Example 1, enabling a diffractive optical element containing a proper amount of hydrogen molecules to be manufactured without doping the hydrogen molecules again.

Example 5

The diffractive optical element in this example is used for a semiconductor exposure apparatus using a KrF laser ($\lambda$=248 nm). The irradiation intensity is 0.8 mJ/cm$^2$/pulse. A silica glass that contains no hydrogen molecules was used, because it is not fragile and can be easily handled. After manufacturing a diffractive optical element through the steps as in Example 1, hydrogen molecules were doped to adjust its concentration to (8E+17 molecules/cm$^3$).

Example 6

The diffractive optical element in this example is used for a semiconductor exposure apparatus using a ArF laser ($\lambda$=193 nm). The irradiation intensity is 1 mJ/cm$^2$/pulse. The silica glass contains hydrogen molecules in a concentration of (5E+18 molecules/cm$^3$).

In the etching step for manufacturing the diffractive optical element by the same steps as in Example 1, hydrogen gas was added in addition to an etching gas such as CF$^4$ to adjust the hydrogen gas concentration so that hydrogen is not decreased and maintains an equilibrium state. The amount of decreased hydrogen may be supplemented in this manufacturing step. Adding hydrogen in the etching gas serves for preventing temperature increase, or is beneficial for processing by increasing the etching rate, because hydrogen has a high heat conductivity. A diffractive optical element containing an appropriate amount of hydrogen could be manufactured without doping hydrogen again.

Example 7

Figure 4:
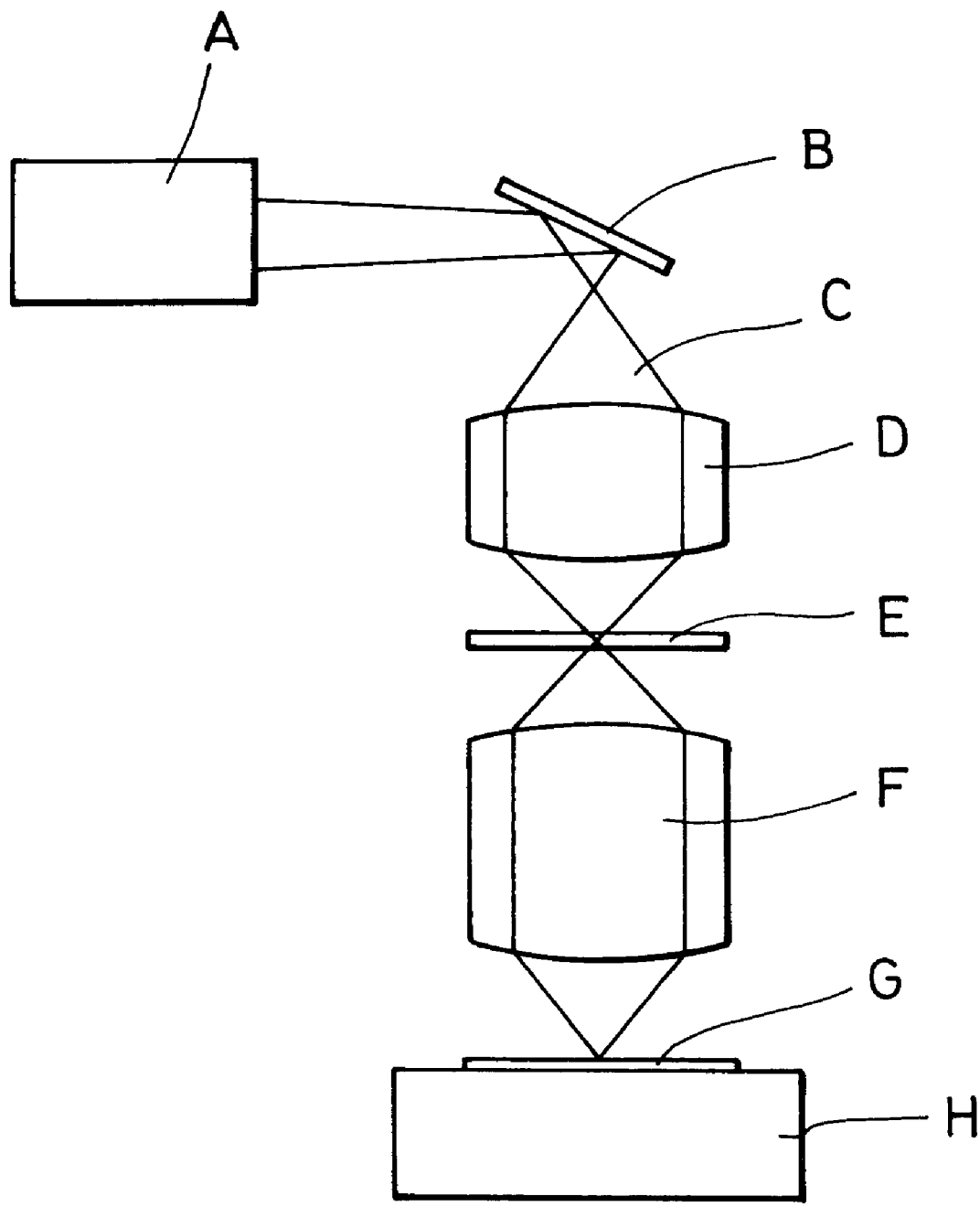
FIG. 4 describes the semiconductor exposure apparatus in the example 7 according to the present invention.

FIG. 4 shows the optical system and semiconductor exposure apparatus in this example. At least one of the diffractive optical elements manufactured in Examples 1 to 6 are used in the illumination optical system D or projection optical system F.

Using the diffractive optical element according to this example can prevent degeneration of the surface of the silica glass, or suppress degeneration of the silica glass due to long term irradiation of the laser beam by applying a hydrofluoric acid treatment or by maintaining an optimum hydrogen molecule concentration. Accordingly, designed optical performance can be certainly exhibited for a long period of time with no change of optical characteristics of the diffractive optical element.

The number of lenses may be reduced by using the diffractive optical element, as compared with the conventional optical system using only the refractive type optical element. Consequently, deformation of the lens or change of refractive index due to heat absorption can be suppressed because light absorption with the silica glass decreases. The laser wavelength band can be widened to effectively utilize laser power by readily correcting chromatic aberration. Moreover, shift of focal point can be minimized even when the installation environment of the semiconductor exposure apparatus has been changed. As a result, transcription of the patterns may be favorably carried out with high accuracy.

Example 8

A method for manufacturing a semiconductor device (semiconductor element) making use of the semiconductor exposure apparatus mounting at least one of the diffractive optical element according to Example 1 to 6 will be described hereinafter.

Figure 5:
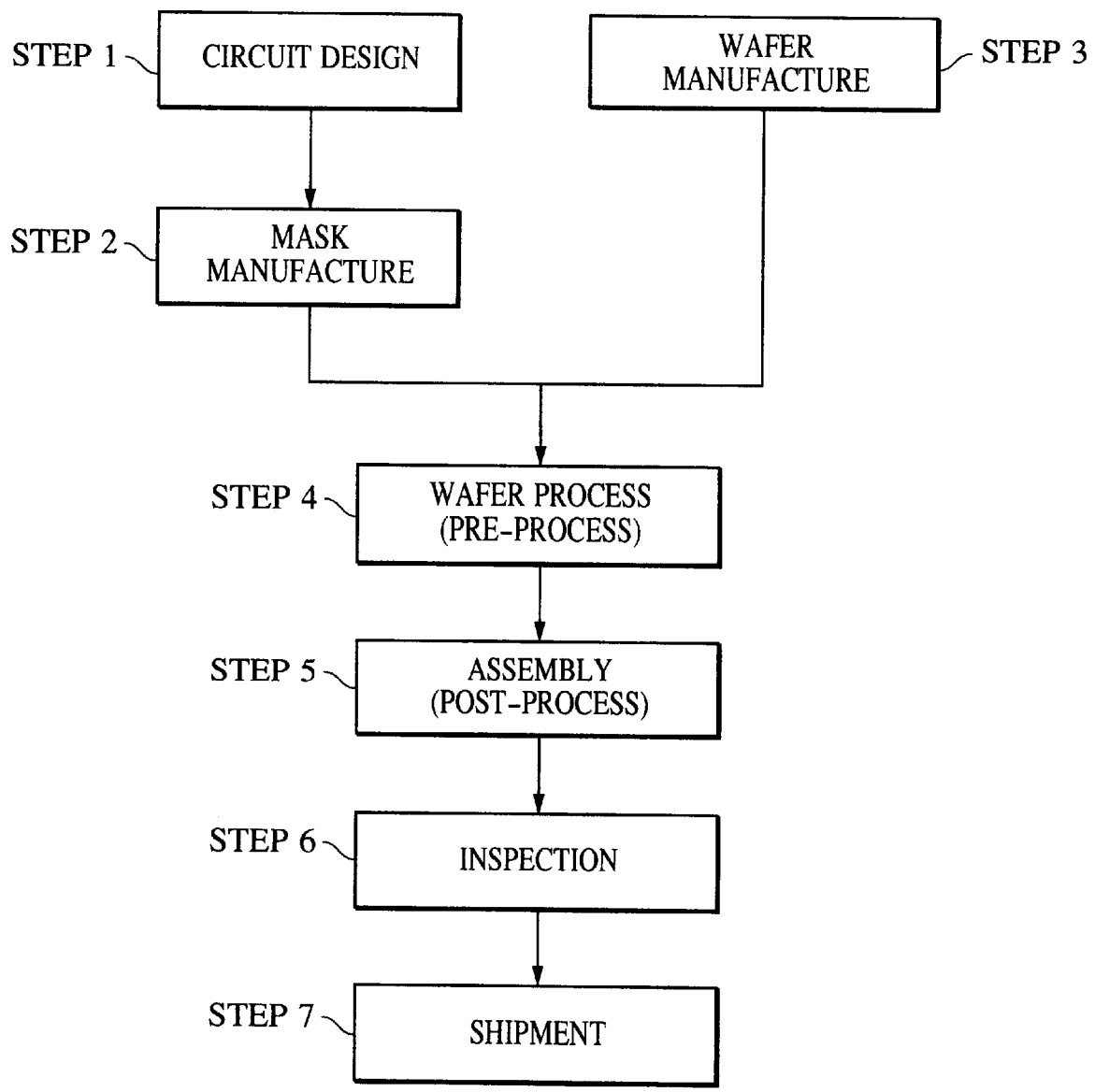
FIG. 5 describes a flow chart for manufacturing a semiconductor device manufactured using the semiconductor exposure apparatus in the example 8 according to the present invention.

FIG. 5 is a flow chart for manufacturing a semiconductor device (semiconductor chips for IC and LSI, liquid crystal panels or CCD). In the step 1 (circuit design) of this example, the circuit for the semiconductor device is designed. A reticle on which designed circuit patterns are formed is manufactured in the step 2 (mask manufacture). In the step 3 (wafers manufacture), on the other hand, a wafer is manufactured using materials such as silicon. The step 4 is called a pre-process, and practical circuits are formed on the wafer using the previously prepared semiconductor exposure apparatus.

The next step 5 (assembly) is called a post-process. The semiconductor is processed into a chip in this step using the wafer manufactured in the step 4, and an assembly step (dicing, bonding) and a packaging step (sealing of chips) are included in this step.

In the step 6 (inspection), operational and durability tests of the semiconductor device manufactured in the step 5 are performed. The device is completed through these steps, and is delivered in the step 7.

Figure 6:
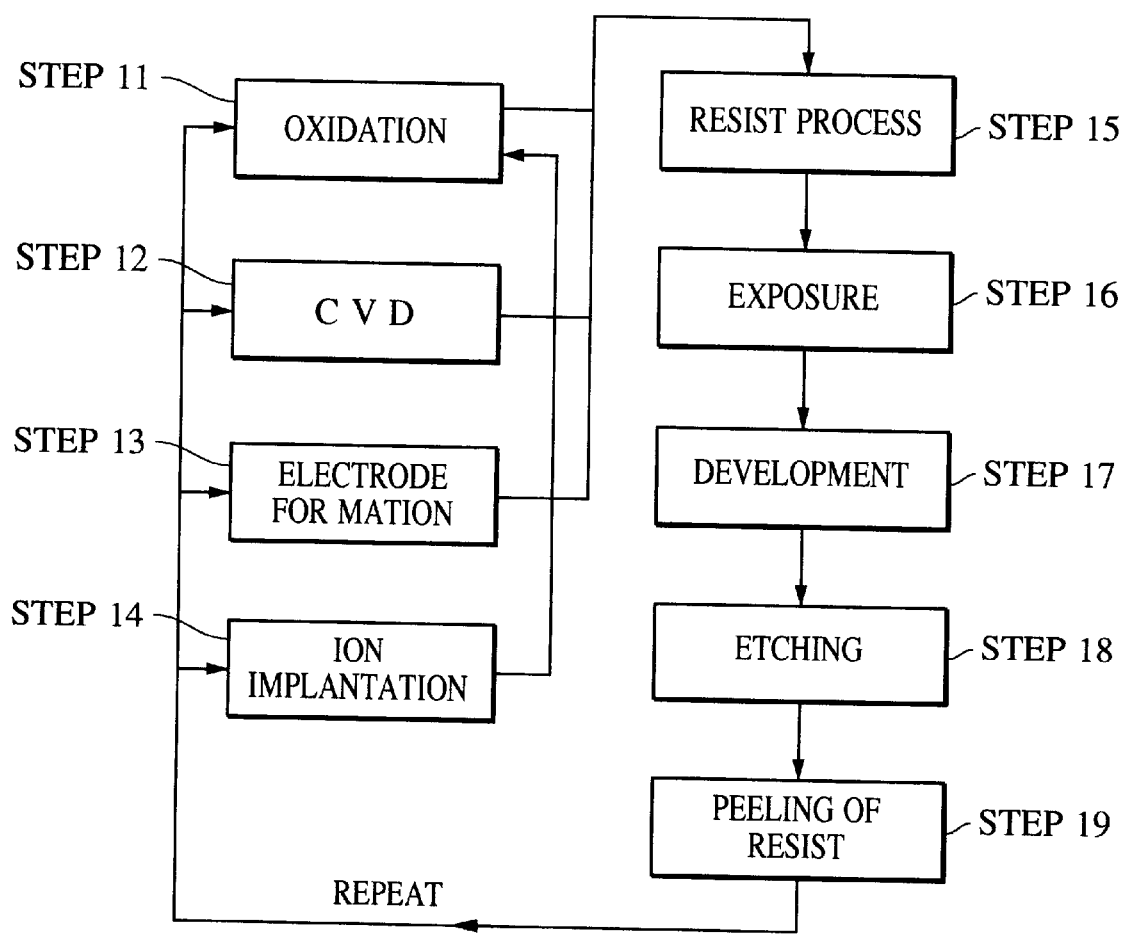
FIG. 6 shows a detailed flow chart of the wafer process in the flow chart for manufacturing the semiconductor device manufactured using the semiconductor exposure apparatus in the example 8 according to the present invention.

FIG. 6 shows a detailed flow chart of the wafer process in the step 4. The surface of the wafer is oxidized in the step 11 (oxidation). An insulation film is formed on the surface of the wafer in the step 12 (CVD).

Electrodes are formed on the wafer by vacuum deposition in the step 13 (electrode formation). Ions are implanted in the wafer in the step 14 (ion implantation). A resist is coated in the step 15 (resist process).

Circuit patterns of a mask are exposed and printed on the wafer using the previously prepared semiconductor exposure apparatus in the step 16 (exposure). Shift of the pattern is detected with an alignment unit after loading the wafer, and the wafer is positioned by driving the wafer stage. The wafer is exposed after completing positioning. After exposure, the wafer is transferred by steps to the next shot to repeat the operations after the alignment step.

The exposed wafer is developed in the step 17 (development). The portions other than the developed resist portion is shaved off in the step 18 (etching). Multiple circuit patterns are formed on the wafer by repeating these steps.

Mass production of the semiconductor device that has been difficult becomes possible by using the manufacturing method according to this example, enabling the semiconductor device to be certainly supplied for an extended period of time.

While the diffractive optical element to be used for the semiconductor exposure apparatus using KrF and ArF eximer lasers has been described in the embodiment according to the present invention, the present invention is by no means restricted to these example. Any methods are included within the scope of the present invention, so long as they are used on the premise that an optical element derived from high purity silica glass is used within the wavelength range available. For example, the optical element can be used for a shorter wavelength eximer laser such as f2 laser (157 nm).

While the thickness of the silica glass was defined to be 1 mm, any thickness within the range of 0.5 mm to 10 mm may be also used.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structured and functions.

What is claimed is:

1. A method for manufacturing an optical element comprising the steps of:
    processing a high purity synthetic silica glass by lithography; and
    allowing the silica glass to contain hydrogen,
    wherein the lithography process comprises resist process, exposure, development and etching.
2. A method according to claim 1, comprising the step of treating the silica glass with a chemical solution containing hydrofluoric acid after the lithography process.
3. A method according to claim 1, wherein the silica glass contains hydrogen molecules in a concentration of (5E+16 molecules/cm$^3$) to (5E+19 molecules/cm$^3$).
4. A method according to claim 1, wherein the silica glass has a thickness of 0.5 to 10 mm.
5. A method according to claim 1, wherein the optical element has a thickness of 0.5 to 10 mm.
6. A method according to claim 1, wherein the optical element contains hydrogen molecules in a concentration of (5E+16 molecules/cm$^3$) to (5E+19 molecules/cm$^3$).
7. A method according to claim 1, wherein the optical element is used for an eximer laser.
8. A method according to claim 7 for manufacturing an optical element to be irradiated with an eximer laser with an intensity of 0.01 to 1 mJ/cm$^2$/pulse, wherein the optical element contains hydrogen molecules in a concentration of (5E+16 molecules/cm$^3$) to (5E+18 molecules/cm$^3$).
9. A method according to claim 7 for manufacturing an optical element to be irradiated with an eximer laser with an intensity of 1 to 100 mJ/cm$^2$/pulse, wherein the optical element contains hydrogen molecules in a concentration of (1E+18 molecules/cm$^3$) to (5E+19 molecules/cm$^3$).
10. A method according to claim 1, wherein the optical element is a diffractive optical element.
11. A method according to claim 1,
    wherein the optical element is a diffractive optical element,
    each thickness of the silica glass and optical element is within a range of 0.5 mm to 10 mm, and
    the optical element contains hydrogen molecules in a concentration of (5E+16 molecules/cm$^3$) to (5E+19 molecules/cm$^3$).
12. A method for manufacturing an optical element comprising the steps of:
    processing the a high purity synthetic silica glass by lithography; and
    allowing the silica glass to contain hydrogen gas before processing the silica glass.
13. A method for manufacturing an optical element according to claim 12,
    wherein the silica glass after allowing it to contain hydrogen and before processing contains hydrogen molecules in a concentration of (5E+17 molecules/cm$^3$) to (5E+20 molecules/cm$^3$).
14. A method according to claim 12,
    wherein the silica glass is treated with a chemical solution containing hydrofluoric acid after processing the silica glass.
15. A method for manufacturing an optical element according to claim 12,
    wherein the silica glass contains hydrogen molecules in a concentration of (5E+16 molecules/cm$^3$) to (5E+19 molecules/cm$^3$).
16. A method according to claim 12,
    wherein the silica glass has a thickness of 0.5 mm to 10 mm.
17. A method according to claim 12,
    wherein the optical element has a thickness of 0.5 mm to 10 mm.
18. A method for manufacturing an optical element according to claim 12,
    wherein the optical element contains hydrogen molecules in a concentration of (5E+16 molecules/cm$^3$) to (5E+19 molecules/cm$^3$).
19. A method according to claim 12,
    wherein the optical element is used for an eximer laser.
20. A method according to claim 19,
    wherein the eximer laser has an intensity of 0.01 to 1 mJ/cm$^2$/pulse, and the optical element to be irradiated with the eximer laser is manufactured so as to contain hydrogen molecules in a concentration of (5E+16 molecules/cm$^3$) to (5E+18 molecules/cm$^3$).
21. A method according to claim 19,
    wherein the eximer laser has an intensity of 1 to 100 mJ/cm$^2$/pulse, and the optical element to be irradiated with the eximer laser is manufactured so as to contain hydrogen molecules in a concentration of (1E+18 molecules/cm$^3$ to (5E+19 molecules/cm$^3$).
22. A method according to claim 12, wherein the optical element is a diffractive optical element.
23. A method according to claim 12,
    wherein the optical element is a diffractive optical element,
    each thickness of the silica glass and optical element is in the range of 0.5 mm to 10 mm, and
    the optical element contains hydrogen molecules in a concentration of (5E+16 molecules/cm$^3$) to (5E+19 molecules/cm$^3$).

24. A method for manufacturing an optical element comprising the steps of:

processing a high purity synthetic silica glass by lithography, wherein the lithography process comprises a dry etching step, the dry etching step being carried out in an etching gas and added hydrogen gas.

25. A method according to claim 24, wherein the silica glass is treated with a chemical solution containing hydrofluoric acid after the lithography process.

26. A method according to claim 24, wherein the silica glass contains hydrogen molecules in a concentration of (5E+16 molecules/cm$^3$) to (5E+19 molecules/cm$^3$).

27. A method according to claim 24, wherein the silica glass has a thickness of 0.5 mm to 10 mm.

28. A method according to claim 24, wherein the optical element has a thickness of 0.5 mm to 10 mm.

29. A method according to claim 24, wherein the optical element contains hydrogen molecules in a concentration of (5E+16 molecules/cm$^3$) to (5E+19 molecules/cm$^3$).

30. A method according to claim 24, wherein the optical element is used for an eximer laser.

31. A method according to claim 30, wherein the eximer laser has an intensity of 0.01 to 1 mJ/cm$^2$/pulse, and the optical element to be irradiated with the eximer laser is manufactured so as to contain hydrogen molecules in a concentration of (5E+16 molecules/cm$^3$) to (5E+18 molecules/cm$^3$).

32. A method according to claim 30, wherein the eximer laser has an intensity of 1 to 100 mJ/cm$^2$/pulse, and the optical element to be irradiated with the eximer laser is manufactured so as to contain hydrogen molecules in a concentration of (1E+18 molecules/cm$^3$) to (5E+19 molecules/cm$^3$).

33. a method according to claim 24, wherein the optical element is a diffractive optical element.

34. A method according to claim 24, wherein the optical element is a diffractive optical element, each of the silica glass and optical element has a thickness in the range of 0.5 mm to 10 mm, and the optical element contains hydrogen molecules in a concentration of (5E+16 molecules/cm$^3$) to (5E+19 molecules/cm$^3$).

* * * * *

UNITED STATES PATENT AND TRADEMARK OFFICE
CERTIFICATE OF CORRECTION

PATENT NO.     : 6,627,468 B2
DATED          : September 30, 2003
INVENTOR(S)    : Keiko Chiba It is certified that error appears in the above-identified patent and that said Letters Patent is hereby corrected as shown below:

Title page,
Item [56], References Cited, FOREIGN PATENT DOCUMENTS,
"JP 6-48734 2/1999                 -- JP 6-48734 2/1994
 JP 10-330120 12/1999" should read    JP 10-330120 12/1998 --.

Drawings,
Sheet 6, Fig. 6, "FOR MATION" should read -- FORMATION --.

Column 1,
Line 26, "a" should read -- an --.

Column 2,
Lines 15, 18, 31, 40 and 50, "eximer" should read -- excimer --;
Line 31, "ad" should read -- as --; and
Line 60, "defines" should read -- defined --.

Column 4,
Lines 6, 7 and 11, "eximer" should read -- excimer --;
Line 15, "element," should read -- element. --; and
Line 16, "each" should read -- Each --.

Column 11,
Line 32, "structured" should read -- structures --;
Lines 57, 59 and 64, "eximer" should read -- excimer --; and
Lines 58 and 63, "claim 7" should read -- claim 7, --.

Column 12,
Line 8, "molecules/cm$^3$)to" should read -- molecules/cm$^3$) to --;
Lines 44, 46, 48, 52 and 54, "eximer" should read -- excimer --; and
Line 56, "molecules/cm$^3$"" should read -- molecules/cm$^3$) --.

Column 13,
Line 27, "eximer" should read -- excimer --.

UNITED STATES PATENT AND TRADEMARK OFFICE
CERTIFICATE OF CORRECTION

PATENT NO. : 6,627,468 B2
DATED : September 30, 2003
INVENTOR(S) : Keiko Chiba

It is certified that error appears in the above-identified patent and that said Letters Patent is hereby corrected as shown below:

<u>Column 14,</u>
Lines 2, 5, 8 and 10, "eximer" should read -- excimer --.

Signed and Sealed this

Twenty-third Day of March, 2004

JON W. DUDAS
*Acting Director of the United States Patent and Trademark Office*